United States Patent [19]

Ball

[11] Patent Number: 4,781,953

[45] Date of Patent: Nov. 1, 1988

[54] PLASTIC CARRIER TAPE HAVING LOWERED CROSS RAILS

[75] Inventor: John F. Ball, Scottsdale, Ariz.

[73] Assignee: Motorola Inc., Schaumburg, Ill.

[21] Appl. No.: 30,792

[22] Filed: Mar. 27, 1987

[51] Int. Cl.⁴ .............................................. B65D 85/30
[52] U.S. Cl. ..................................... 428/35; 206/328; 206/332
[58] Field of Search ............... 206/332, 329, 328, 334; 428/35

[56] References Cited

U.S. PATENT DOCUMENTS

| | | | |
|---|---|---|---|
| 3,191,791 | 6/1965 | Jackson | 206/332 |
| 3,946,864 | 3/1976 | Hutson | 206/332 |
| 4,450,959 | 5/1984 | Sommer | 206/332 |
| 4,671,407 | 6/1987 | Brutosky | 206/332 |
| 4,702,370 | 10/1987 | Honda | 206/332 |
| 4,712,675 | 12/1987 | Scholten et al. | 206/332 |

FOREIGN PATENT DOCUMENTS

| | | | |
|---|---|---|---|
| 3605491 | 8/1986 | Fed. Rep. of Germany | 206/329 |
| 2163401 | 2/1986 | United Kingdom | 206/328 |

Primary Examiner—John E Kittle
Assistant Examiner—James J. Seidleck
Attorney, Agent, or Firm—Harry A. Wolin

[57] ABSTRACT

A plastic carrier tape for electronic components and the like having cross rails at a predetermined distance below taping rails thereby allowing for a more uniform adhesion of a tape cover to the plastic carrier tape. This more uniform adhesion will allow for a uniform pull force to remove a tape cover thereby enabling the plastic carrier tape to be more easily used in an automated production line.

8 Claims, 1 Drawing Sheet

4,781,953

PLASTIC CARRIER TAPE HAVING LOWERED CROSS RAILS

BACKGROUND OF THE INVENTION

This invention generally pertains to a plastic carrier tape having cross rails. Generally, in packaging and unpackaging electronic components and the like, it is desirable to have a carrier tape to which a tape cover can be easily and consistently affixed and removed. Many existing carrier tapes have both taping rails and cross rails which are disposed at the same height. Therefore, when a tape cover is applied, it adheres to both the taping rails and the cross rails. Because of the increased area to which the tape adheres, it is very difficult to obtain a uniform adhesion throughout. Because of this non-uniform adhesion, it is common that an uneven pull force be applied to the tape cover in order to remove it from the carrier tape. This uneven pull force causes deformations and tearing throughout both the tape cover and carrier tape. Another detriment in existing carrier tapes is that adhesion surfaces are rough or rippled where taping rails and cross rails meet. Rough adhesion surfaces also cause an uneven pull force to be applied for tape cover removal. Because of these and other detriments, it is desirable that a carrier tape having a lesser amount of adhesion surfaces which are smooth be manufactured so that packaging and unpackaging of electronic components and the like may be performed with relative ease.

SUMMARY OF THE INVENTION

The present invention pertains to a plastic carrier tape for electronic components and the like. This carrier tape generally has a plurality of component pockets which are defined by four sides. Attached to the lateral sides, in a common plane, are taping rails which have an upper surface which is smooth. The longitudinal sides are defined by cross rails which also serve to separate one component pocket from another. These cross rails are disposed in a common plane that is a predetermined distance below the plane in which the taping rails lie. This allows for a reduced adhesion area when a tape cover is applied to the top of the carrier tape. This reduced adhesion surface will allow for a more uniform pull force to remove the tape cover. This in turn will prevent tearing and deforming the carrier tape and the tape cover. Additionally, one or more of the taping rails of the present invention may contain sprocket holes. This is so the carrier tape may be used on an automated assembly line.

It is an object of the present invention to provide a new and improved plastic carrier tape having reduced adhesion surfaces.

It is a further object of the present invention to provide a new and improved plastic carrier tape having its cross rails a predetermined distance below its taping rails.

It is a further object of the present invention to provide a new and improved plastic carrier tape having adhesion surfaces which are smooth throughout.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
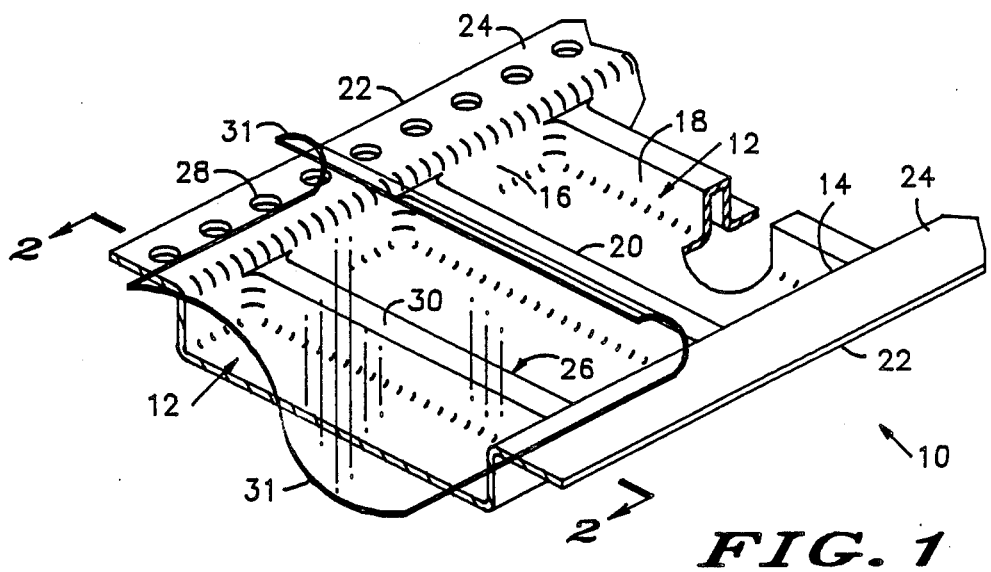
FIG. 1 is a perspective view of a plastic carrier tape embodying the present invention.
Figure 2:
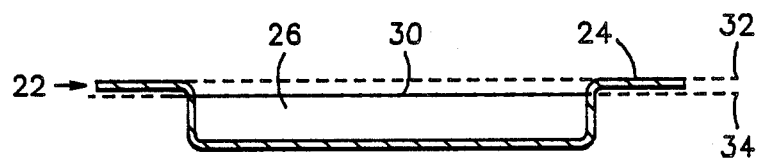
FIG. 2 is a cross-sectional view of the plastic carrier tape of FIG. 1 taken from line 2—2 of FIG. 1.

Referring specifically to FIGS. 1 and 2, perspective and cross-sectional views, respectively, are shown of a plastic carrier tape, 10 embodying the present invention. Plastic carrier tape 10 is made of a flexible plastic in this embodiment such as PETG Thermoplastic (anti-static) or PVC (static sensitive), however, it should be understood that plastic carrier tape 10 may be made of other materials which may be anti-static or static sensitive. Plastic carrier tape 10 may be made of a static sensitive or anti-static material depending on the type of component that plastic carrier tape 10 will be used for. Plastic carrier tape 10 is shown to have a plurality of component pockets, 12. Each component pocket 12 has a first side, 14, a second side, 16, a third side, 18, and a fourth side, 20. Disposed above and extending from both first side 14 and second side 16 of component pocket 12 are taping rails 22. Each taping rail 22 has an upper surface, 24, which is smooth. Taping rails 22 all lie in a first common plane represented by a dotted line, 32 (FIG. 2). Upper surface 24 of taping rail 22 is smooth so that a tape cover, 31, may be easily affixed to and removed from plastic carrier tape 10. If taping rail 22 had a rough or rippled upper surface 24, an uneven pull force would need to be applied to remove tape cover 31. Smooth upper surface 24 of taping rail 22 substantially remedies this problem and prevents tearing and deformation of plastic carrier tape 10 and tape cover 31. Also shown disposed in taping rails 22 are a plurality of sprocket holes, 28. Sprocket holes 28 enable plastic carrier tape 10 to be used in an automated production process. It should be understood that sprocket holes 28 may exist in one or more of taping rails 22 although the present embodiment shows only one taping rail 22 having sprocket holes 28.

Plastic carrier tape 10 is shown to have a plurality of cross rails, 26. Cross rails 26 serve to separate each of the plurality of component pockets 12. Cross rails 26 form third sides 18 and fourth sides 20 of component pockets 12. Cross rails 26 include top surfaces, 30, which all are in a second common plane represented by a dotted line 34 (FIG. 2), a predetermined distance below first common plane 32. This is so that when tape cover 31 is applied to plastic carrier tape 10, tape cover 31 adheres only to taping rails 22 and not to cross rails 26 or the junctions therebetween. Because tape cover 31 adheres only to taping rails 22, there exists an even bond throughout plastic carrier tape 10 thereby enabling an even pull force to remove tape cover 31 from plastic carrier tape 10. An even pull force greatly reduces problems of deformation and tearing of both plastic carrier tape 10 and tape cover 31. Additionally, a more uniform adhesion throughout plastic carrier tape 10 allows for plastic carrier tape 10 to be used more easily in an automated production process.

Thus, it is apparent that there has been provided, in accordance with the invention, an improved plastic carrier tape which meets the objects and advantages set forth above. While we have shown and described specific embodiments of this invention, further modifications and improvements will occur to those skilled in the art. We desire to be understood, therefore, that this invention is not limited to the particular form shown and we intend in the appended claims to cover all modifications which do not depart from the spirit and scope of this invention.

What is claimed is:

1. A carrier tape comprised solely of plastic comprising:
   a plurality of component pockets, each of said component pockets having a first side, a second side, a third side and a fourth side;
   a plurality of taping rails each having an upper surface in a first common plane, said taping rails being disposed along said first and said second sides of said component pockets; and
   a plurality of cross rails, said cross rails defining said third and said fourth sides of said component pockets, said cross rails including top surfaces disposed in a second common plane, a predetermined distance below said first common plane.

2. The plastic carrier tape of claim 1 wherein each upper surface of each taping rail is smooth.

3. The plastic carrier tape of claim 2 further comprising a plurality of sprocket holes in at least one taping rail.

4. The plastic carrier tape of claim 1 wherein said plastic carrier tape is comprised of a flexible, static sensitive plastic.

5. The plastic carrier tape of claim 1 wherein said plastic carrier tape is comprised of a flexible, antistatic plastic.

6. A flexible carrier tape comprised solely of plastic comprising:
   at least one component pocket, each said component pocket having a first side, a second side, a third side and a fourth side;
   a plurality of taping rails in a first common plane, each having a smooth upper surface, said taping rails being disposed along said first and said second sides of said component pocket;
   a plurality of sprocket holes, said sprocket holes being disposed in at least one of said taping rails; and
   a plurality of cross rails, said cross rails defining said third and said fourth sides of said component pocket, said cross rails including top surfaces disposed in a second common plane, a predetermined distance below said first common plane.

7. The plastic carrier tape of claim 6 wherein said plastic carrier tape is comprised of a static sensitive plastic.

8. The plastic carrier tape of claim 6 wherein said plastic carrier tape is comprised of an anti-static plastic.

* * * * *